United States Patent [19]
Agonafer et al.

[11] Patent Number: 5,719,745
[45] Date of Patent: Feb. 17, 1998

[54] EXTENDED SURFACE COOLING FOR CHIP STACK APPLICATIONS

[75] Inventors: Dereje Agonafer; Timothy Merrill Anderson; Gregory Martin Chrysler; Richard Chao-Fan Chu, all of Poughkeepsie, N.Y.

[73] Assignee: International Business Machines Corporation, Armonk, N.Y.

[21] Appl. No.: 716,801

[22] Filed: Sep. 16, 1996

Related U.S. Application Data

[63] Continuation of Ser. No. 501,689, Jul. 12, 1995, abandoned.

[51] Int. Cl.⁶ .................................................. H05K 7/20
[52] U.S. Cl. ........................ 361/704; 174/16.3; 757/722; 361/710
[58] Field of Search ............................... 361/703–705, 361/707, 709–712, 717, 719; 165/80.3, 185; 257/706, 707, 712, 713, 722–724; 174/16.3

[56] References Cited

U.S. PATENT DOCUMENTS

| | | |
|---|---|---|
| 4,441,140 | 4/1984 | Richard .................................. 361/386 |
| 4,612,601 | 9/1986 | Watari .................................... 361/387 |
| 4,868,712 | 9/1989 | Woodman . |
| 4,888,637 | 12/1989 | Sway-Tin et al. . |
| 5,016,138 | 5/1991 | Woodman . |
| 5,032,896 | 7/1991 | Little et al. . |
| 5,040,052 | 8/1991 | McDavid . |
| 5,051,865 | 9/1991 | Kato ....................................... 361/386 |
| 5,081,067 | 1/1992 | Shimizu et al. . |
| 5,107,586 | 4/1992 | Eichelberger et al. . |
| 5,155,661 | 10/1992 | Nagesh et al. . |
| 5,180,001 | 1/1993 | Okada et al. . |
| 5,220,014 | 6/1993 | Lin . |
| 5,323,293 | 6/1994 | Angiulli ................................. 361/699 |
| 5,323,295 | 6/1994 | Pines ..................................... 361/709 |
| 5,323,845 | 6/1994 | Kin-Shon .............................. 174/16.3 |

FOREIGN PATENT DOCUMENTS

| | | |
|---|---|---|
| 63-192251 | 8/1988 | Japan . |
| 63-280444 | 11/1988 | Japan . |
| 1704303 | 1/1992 | U.S.S.R. ............................... 174/16.3 |
| 2052164 | 1/1981 | United Kingdom ................. 174/16.3 |

*Primary Examiner*—Gerald P. Tolin
*Attorney, Agent, or Firm*—Lawrence D. Cutter

[57] ABSTRACT

A heat sink is provided for use with stacks of integrated circuit chips. The heat sink comprises a thermally conductive body having a recess in which the chip stack is disposed. The heat sink also includes fins which extend away from the recess. In one embodiment, fins are provided inside the recess for improved cooling of higher power chips such as a microprocessor which is surrounded by less thermally demanding memory chips.

3 Claims, 4 Drawing Sheets

EXTENDED SURFACE COOLING FOR CHIP STACK APPLICATIONS

This application is a continuation of application Ser. No. 08/501,689, filed Jul. 12, 1995, now abandoned.

FIELD OF THE INVENTION

This invention relates to cooling of chip stacks (that is, multiple computer chips stacked on top of each other or in a side by side arrangement with or without physical contact between chip). More particularly, this invention includes a heat sink which provides air cooling for chip stacks, particularly chip stacks in which interior chips produce more heat than chips at the top, bottom or ends of the stack. The present invention is also directed to arrays of chip stacks employing special purpose heat sinks as described herein and which are mounted on a circuit board for cooling.

BACKGROUND OF THE INVENTION

As computer manufacturers have attempted to build more powerful machines, the use of chip stacks in modern computing applications has become increasingly desirable. In essence, a chip stack comprises multiple computer chips which are stacked together (back-to-front or back-to-back). The chip stacks may be oriented either in face up position or in a side-to-side orientation with chip edges down.

There are a number of advantages to the chip stack configuration over conventional single chip arrangement. In particular, the chip stacks provide a more compact means by which computers and other high speed electronic systems may be constructed.

In addition, chip stacks particularly allow for more efficient use of space on circuit boards. In stacking chip on top of chip, the stack takes advantage of relatively less valuable space above the circuit board, while at the same time leaving a small footprint on the board or card, thereby increasing the space available for other components or chip stacks.

While there do exist numerous advantages to a stacked chip configuration, there are also problems associated with it. Specifically, larger and larger chip stacks create unique cooling problems. Because the chip stacks contain multiple chips, they generate more heat per unit volume, requiring greater heat dissipation. Moreover, this dissipation must occur now through several layers of silicon (or other semiconductor material). However, in contrast to single chip placements, chip stacks provide significantly smaller surface areas that may be used for heat sinks. In view of this problem, the general response in the industry to the need for cooling chip-stacks has been to immerse the entire chip-stack in liquid or operate at greatly reduced power levels. This is often an unwelcome solution because of technical concerns and also because of customer preferences.

SUMMARY OF THE INVENTION

The present invention is generally directed at providing a mechanism whereby heat generated by chip stacks (sometimes referred to as "chip cubes", although a cubic structure is not necessary) may be dissipated. More particularly, the present invention is directed at providing a system of air cooling for chip stacks, in contrast to liquid cooling systems often proposed for use with chip stack designs. Even more particularly, the present invention provides a preferably extruded heat sink structure, which includes a system of thermal cooling enhancements which create a new low thermal resistance path in order to dissipate heat coming from disparate sources (that is, from different chips within a stack).

Accordingly, it is an object of the present invention to provide a means whereby chip stacks may be air-cooled, rather than relying on immersion in liquid, thereby giving manufacturers increased flexibility in choosing a means by which a chip stack or chip stack array may be implemented.

Another object of the present invention is to create a heat transfer path away from the chip stack, thereby responding to the buildup of heat coming from a variety of disparate sources. By providing an enhanced thermal cooling structure, the present invention simultaneously permits the dissipation of heat away from chip stacks, while dealing with the inherent difficulties of relatively small surface area on which to place heat sinks.

Yet another object of the present invention is to provide a cooling system for a chip stack which uses space above the board to which it is attached, rather than horizontal space on the board, since the space on the board is more "valuable" than space above it.

An even further object of the present invention is the placement of electronic circuit chip devices in close proximity to one another to reduce signal propagation delays.

Accordingly, it is a concomitant object of the present invention to enable the design and construction of faster computational and signal processing systems.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1A:
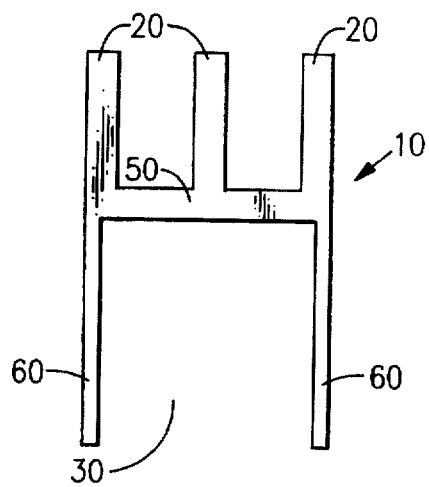
FIG. 1A is a front view of one embodiment of the present invention, particularly the heat sink showing the thermal cooling area enhancing projections and a recess for accommodating a chip stack.

FIG. 1A provides a front view of a heat sink in accordance with the present invention. In particular, it is seen that heat sink 10 possesses recess 30 into which a chip stack may be placed. Correspondingly, in some methods of practicing the present invention, it is noted that heat sink 10 is put into position over an already attached chip stack. In particular, in FIG. 1A it is noted that heat sink 10 possesses recess 30 which includes at least two side walls 60. In certain embodiments of the present invention, however, recess 30 preferably possesses four side walls. Whether or not two or four side walls are present for recess 30 is typically, though not necessarily, determined by the manufacturing technique for heat sink 10. In particular, if heat sink 10 is produced through the use of an extrusion process, typically only two side walls 60 are present. However, in those situations in which heat sink 10 is a machined structure, recess 30 typically possesses four side walls. It is additionally noted that even if heat sink 10 is produced using an extrusion process, it is nonetheless possible to affix additional side wall portions thereto so as to form a five-sided recess.

Figure 1B:
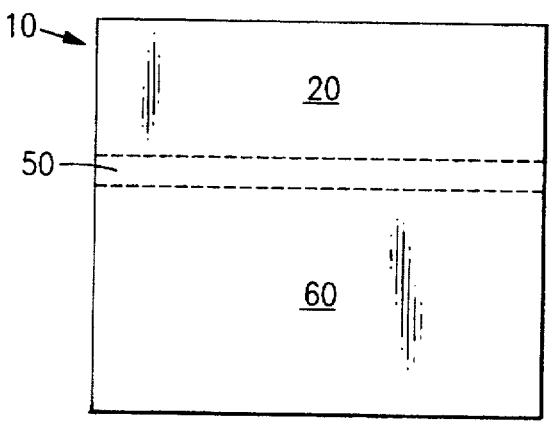
FIG. 1B is a side view of the heat sink shown in FIG. 1A.

In FIG. 1A it is also noted that heat sink 10 includes thermal cooling area enhancing projections 20 which extend away from recess 30 in an upward direction. Projections 20 are more colloquially referred to as "fins". FIG. 1B shows a side view of the heat sink from FIG. 1A.

Heat sink 10 comprises a thermally conductive material. In particular, heat sink 10 preferably comprises a metal such as aluminum or copper. Aluminum is preferable in those circumstances in which lightweight, less costly or more easily transportable assemblies are desired.

Figure 9:
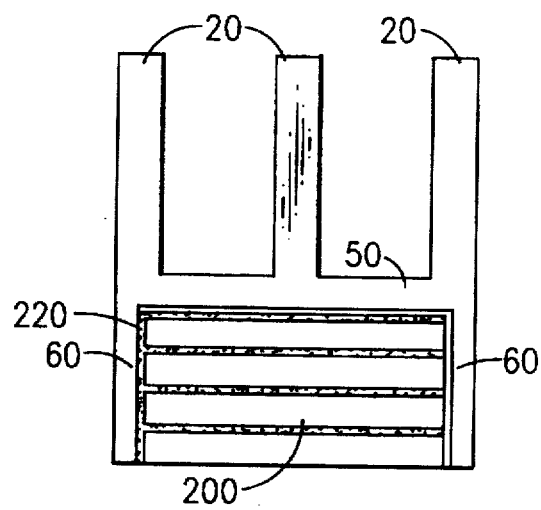
FIG. 9 is a front view of a heat sink of the present invention illustrating a variation in thermal paste or epoxy placement.

As indicated above, in practice, chip stack 200 (see FIG. 2) may be affixed to a circuit board prior to its coupling with heat sink 10 or, correspondingly, it is possible in circumstances which permit it, for chip stack 200 first to be placed within recess 30 in heat sink 10 before circuit board attachment. Additionally, in preferred embodiments of the present invention, it is desirable to employ a thermal conductivity enhancing medium (220 in FIG. 2) which is disposed between chip stack 200 and the interior surfaces of recess 30. Such materials include thermal pastes and thermal epoxies. In some embodiments of the present invention, thermal epoxy, shown as reference numeral 220 in FIG. 2, may comprise a reworkable epoxy material. An alternate arrangement for disposition of conductivity enhancing material is shown in FIG. 9 which particularly shows the presence of this material between chips within the chip stack. This embodiment is particularly useful when conductivity enhancing epoxies are employed or when it is desirable, for reasons of non-matching of coefficients of thermal expansion, to provide an air gap to allow for chip expansion.

Figure 2:
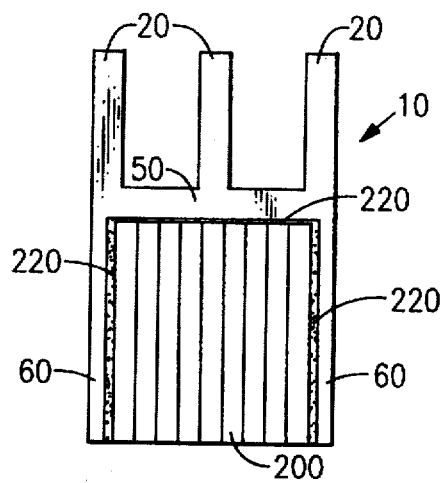
FIG. 2 is a front view of the heat sink of FIG. 1A showing the chip stack in place within the recess.

The heat sink shown in FIGS. 1A, 1B and 2 is particularly effective in solving the problems associated with chip stack cooling. In particular, it is seen that recess side walls 60 are in intimate thermal contact with the chips at the ends of stack 200. It is also seen that this contact is a face-to-face contact between side wall 60 and the faces of chips at the ends of stack 200. This provides an enhanced thermal conduction path from the interior of chip stack 200 to side walls 60 and thence to the body of heat sink 10 which has attached thereto fins 20 for air cooling purposes. Accordingly, it is seen that the heat sink of the present invention is particularly desirable for use in conjunction with chip stacks in that it provides a desired thermal path to projections which are easily air cooled. It is also seen that the present invention provides a mechanism whereby the electronic circuit component density may be increased while at the same time the chip footprint on a circuit board or card is not significantly increased. Nonetheless, the "less valuable" or "more available" space above the circuit board or card is "populated" with heat sink projections for the purposes of air cooling.

When the chip stacks are arranged in a vertical configuration such as shown in FIG. 2, it should be noted that the space filling, thermal conductivity enhancing material 220, is provided to meet problems that exist with respect to chip stacks in this configuration. In particular, it should be appreciated that chips do not tend to all be of the exact same size. Thus, the space at the top of the chip stack tends to be irregular in height. Accordingly, the space filling, thermal conductivity enhancing material 220 not only fills this space but also increases the thermal conductivity between chip stack 200 and heat sink 10. This increase in thermal conductivity is also desirable between chip stack 200 and side walls 60.

Figure 3:
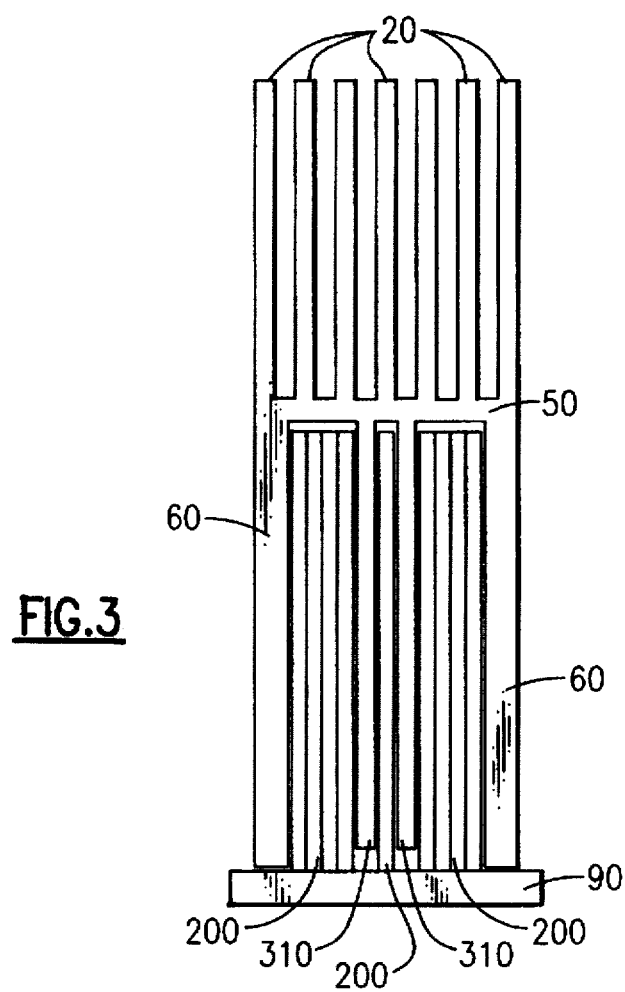
FIG. 3 is a front view of a heat sink in accordance with the present invention, showing thermal cooling area enhancing projections extending into the recess to accommodate hot chips within the center of the stack.

FIG. 3 illustrates an alternate embodiment of the present invention in which the interior of recess 30 is provided with additional fins 310 which extend downward from bridging wall structure 50 which connects and supports side walls 60. While FIG. 3 illustrates an embodiment in which only two projections extend downward into the interior of recess 30, it is nonetheless possible to employ additional internal fins. In particular, the embodiment shown in FIG. 3 is useful in those circumstances in which interior chips generate more heat than exterior chips. In this regard, it is seen in the computer arts that it is often desirable to dispose computer memory in close proximity to the logical processing elements of digital computers. However, the logic circuits tend to generate more heat than the corresponding memory chips. Accordingly, it is seen that it is desirable to provide a structure such as shown in FIG. 3 in which chips disposed between internal fins 310 are microprocessor chips (or the like) while chips disposed between fins 310 and exterior side walls 60 are memory chips. This configuration provides enhanced cooling where it is needed and yet at the same time provides an electronic structure in which logic and memory chips are disposed in close proximity but are nonetheless cooled in accordance with their heat generating characteristics.

Figure 4:
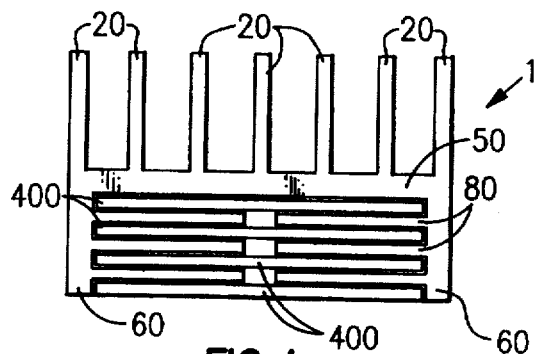
FIG. 4 is a front view of an alternate embodiment of a heat sink of the present invention, showing thermal cooling area enhancing projections extending horizontally into the recess from the recess walls in a direction substantially parallel to the planes of the chips.
Figure 4A:
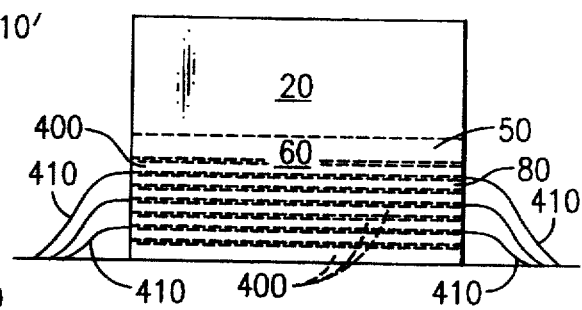
FIG. 4A is a side view of the embodiment shown in FIG. 4.

Yet another embodiment of the invention is shown in FIG. 4. In this embodiment, chips 400 either alone or in relatively short stacks, are disposed on shelves 80 which extend from side walls 60 of heat sink 10'. A plurality of such shelves 80 may be employed. It is particularly noted that the embodiment shown in FIG. 4 is one which may be constructed by extrusion methods. FIG. 4A is a side view of the heat sink and chip stack configuration shown in FIG. 4 and more particularly illustrating the presence of bonded leads 410.

Figure 5A:
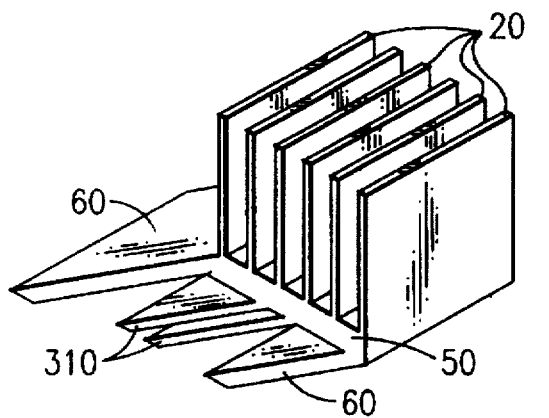
FIG. 5A is an isometric view of a heat sink of the present invention that may be disposed at an angle to an underlying circuit board or card, in order to reduce the required space between circuit boards or cards.
Figure 5B:
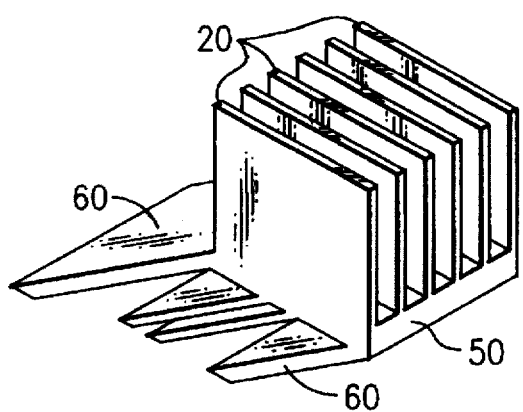
FIG. 5B is a view similar to FIG. 5A with fins oriented in a different direction.

FIG. 5A illustrates yet another embodiment of the present invention in which the chip stack is disposed at an angle with respect to card or board. The embodiment shown in FIG. 5A is manufacturable in a single extrusion and cutting process. However, if it is necessary and/or desirable to employ fins oriented in the opposite direction, the embodiment shown in FIG. 5B may be employed. This latter embodiment is not producible in a single extrusion but could be assembled from two separate extrusions. In such a case, bridging connector 50 would preferably possess the joining seam which would run parallel to the long edges of bridging wall 50.

Figure 5C:
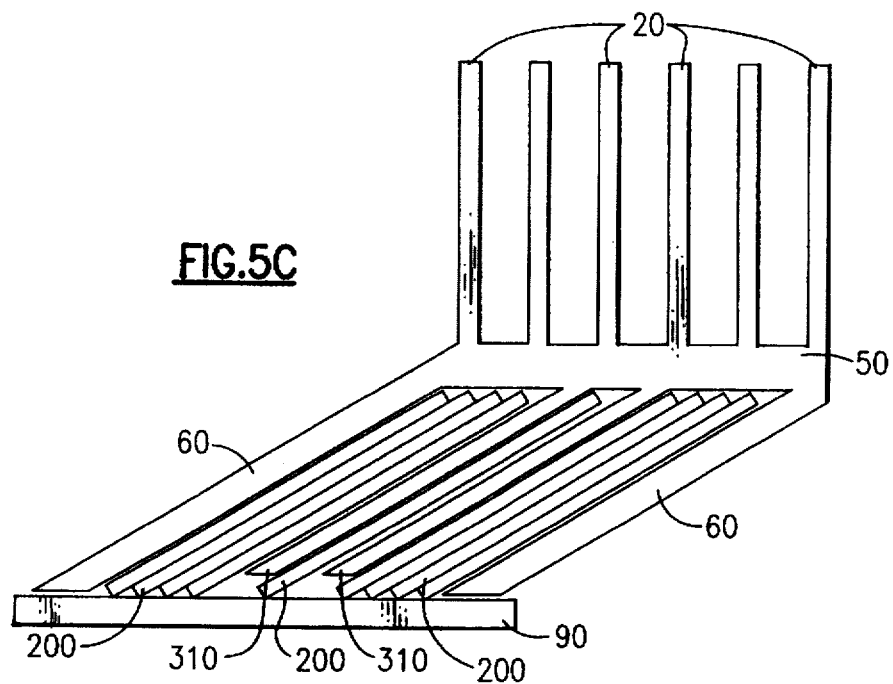
FIG. 5C is an end view of the heat sink of FIG. 5A with chips and/or chip stacks in place.

For the heat sink shown in FIG. 5A, its use with chips and chip stacks 200 is shown in FIG. 5C.

Figure 6:
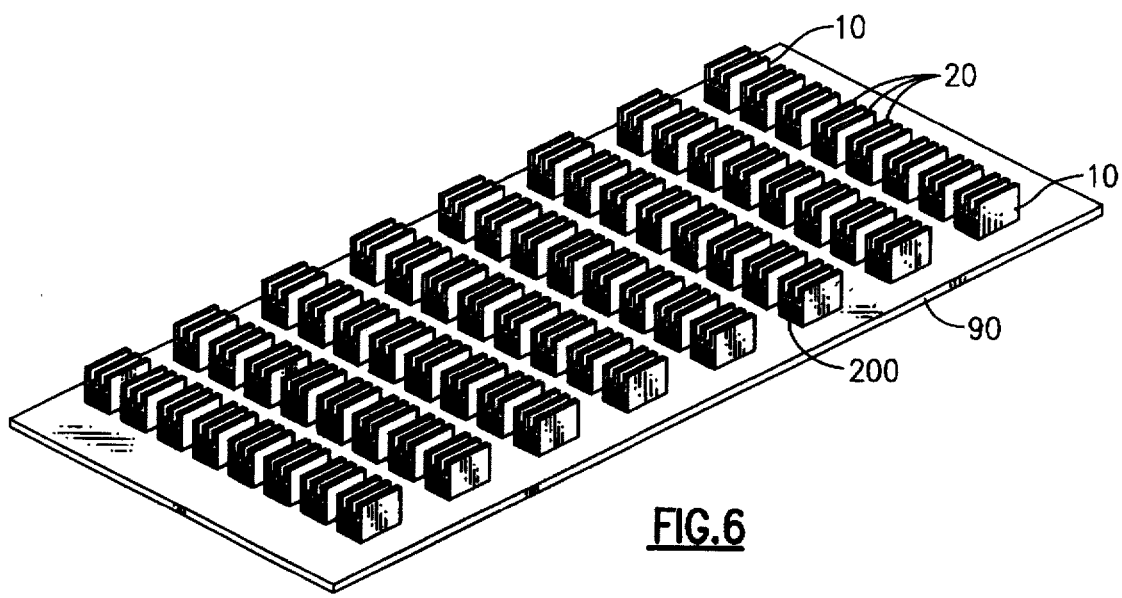
FIG. 6 is an isometric view of a circuit board, upon which there are multiple chip stacks and heat sinks attached.

FIG. 6 illustrates still another embodiment of the present invention in which a plurality of chip stacks 200 possessing heat sinks 10 as described above are mounted on circuit board or card 90. In particular, it is noted that in such configurations it is desirable that fins 20 of heat sinks 10 be substantially aligned in the same direction so as to promote the most efficient flow of cooling air.

Figure 7:
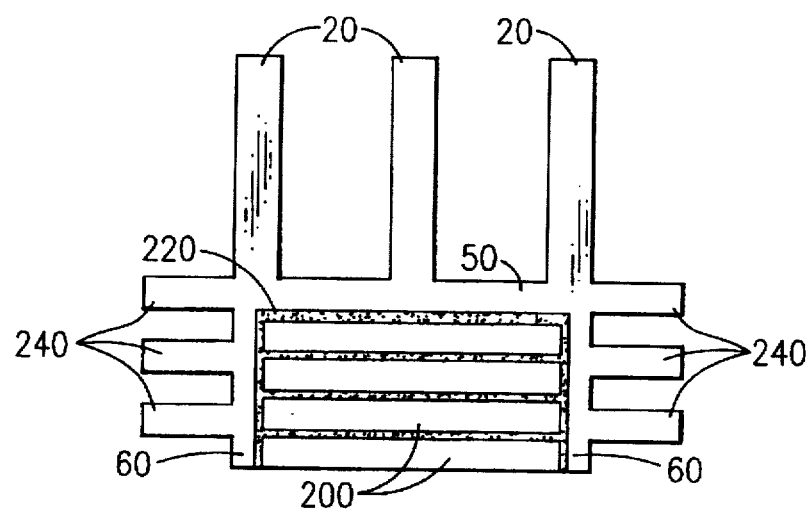
FIG. 7 is a front view of a heat sink with thermal cooling area enhancing projections extending from the side walls in addition to fins at the top of the heat sink.

FIG. 7 illustrates yet another embodiment of the present invention which is particularly applicable in those circumstances in which lateral spacing on a board or card is not at a premium. In such circumstances it is possible to provide heat sink 10 with additional projections 240 which extend laterally therefrom as shown in FIG. 7. Again, it is noted that this is a configuration which is easily constructed by means of extrusion methods.

Figure 8:
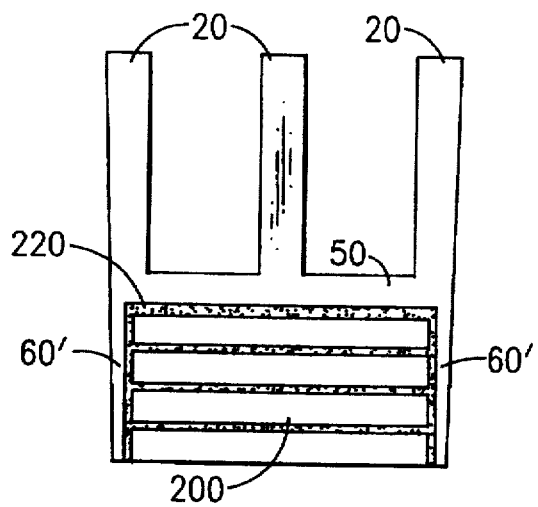
FIG. 8 is a front view of a heat sink in accordance with one embodiment of the invention in which recess side walls are tapered.

FIG. 8 illustrates yet another embodiment of the present invention in which side walls 60' are tapered. This configuration is particularly useful in those circumstances where the chip stack possesses regions which are more or less capable of generating heat. In such circumstances, it is desirable to employ the heat sink in FIG. 8 in a configuration in which the chip cube is oriented so as to have its hotter regions at the top so as to be in contact with bridging wall 50 and also with the wider upper portions of side walls 60'.

While the heat sink of the present invention may be extruded, it is noted that in those circumstances in which the heat sink is employed to protect relatively expensive electronic circuit chips, it may be desirable to incur the extra expense of machining operations as a mechanism for heat sink formation. In such circumstances, the relative cost of the machining is still low with respect to the circuits and systems which the heat sink is designed to protect. And again, it is noted that even in circumstances where extruded structures are employed, it is always possible to affix end wall portions against side walls 60 so as to form a recess having a top and four side walls.

From the above, it should be appreciated that the heat sink and chip stack structures of the present invention fully and completely satisfy all of the objectives set forth above. In particular, it is seen that the heat sink, structures and configurations of the present invention enhance circuit packI age density, improve signal transfer times and at the same time provide a desirable mechanism for chip cooling.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An electronic circuit chip package comprising:
   two low-power chip stacks;
   at least one high-power chip;
   a heat sink having at least three adjacent recesses therein including a central one of said recesses in which there is disposed said at least one high-power chip, and wherein said low-power chip stacks are disposed in remaining ones of said recesses adjacent to said central recess, said low-power chip stacks and said at least one high-power chip being in thermal contact with side walls of said respective recesses, said heat sink also including fins extending outwardly therefrom.

2. The electronic circuit chip package of claim 1 in which said at least one high-power chip is a microprocessor.

3. The electronic circuit chip package of claim 1 in which at least one of said low-power chip stacks comprises memory chips.

* * * * *